United States Patent
Hering et al.

(10) Patent No.: US 7,253,635 B2
(45) Date of Patent: Aug. 7, 2007

(54) METHOD FOR CHECKING THE ELECTRICAL SAFETY OF A HOUSEHOLD APPLIANCE AND CORRESPONDING HOUSEHOLD APPLIANCE

(75) Inventors: Reinhard Hering, Holzheim (DE); Michael Rosenbauer, Reimlingen (DE); Christian Rothauszky, Medlingen (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 0 days.

(21) Appl. No.: 10/873,385

(22) Filed: Jun. 21, 2004

(65) Prior Publication Data

US 2004/0228052 A1 Nov. 18, 2004

Related U.S. Application Data

(63) Continuation of application No. PCT/EP02/12946, filed on Nov. 19, 2002.

(30) Foreign Application Priority Data

Dec. 21, 2001 (DE) ................ 101 63 197

(51) Int. Cl.
*G01R 31/28* (2006.01)
*H02H 3/42* (2006.01)

(52) U.S. Cl. ............... 324/511; 324/509; 361/78
(58) Field of Classification Search ........ 324/509–511, 324/551; 361/78; 700/292–293
See application file for complete search history.

(56) References Cited

U.S. PATENT DOCUMENTS

| 4,117,537 | A | * | 9/1978 | Muench ............... 700/295 |
| 5,003,486 | A | * | 3/1991 | Hendel et al. ........ 700/293 |
| 6,054,865 | A | * | 4/2000 | Bald et al. ............ 324/551 |
| 2002/0024332 | A1 | * | 2/2002 | Gardner ............... 324/103 R |

FOREIGN PATENT DOCUMENTS

| DE | 42 19 970 A1 | 12/1993 |
| DE | 198 53 511 A1 | 6/2000 |
| FR | 2 399 826 | 3/1979 |
| GB | 2 283 870 A | 5/1995 |

* cited by examiner

*Primary Examiner*—Vincent Q. Nguyen
(74) *Attorney, Agent, or Firm*—Russell W. Warnock; Craig J. Loest

(57) ABSTRACT

A nominal setpoint value of the admissible power consumption of a household appliance is respectively set for each electrical component. The actual value of the current consumption of the household appliance is measured according to the electrical components used and is compared with the corresponding setpoint value. A safety measure is triggered if the nominal value is exceeded. The novel household appliance is provided with a control device that includes a device for respectively regulating a nominal value of the admissible current consumption for the electrical components of the household appliance, a device for measuring the actual value of the current consumption of the household appliance according to the electrical components used, and a comparator for comparing the actual value with the corresponding nominal value. The unit triggers a safety measure if the setpoint value is exceeded.

13 Claims, 1 Drawing Sheet

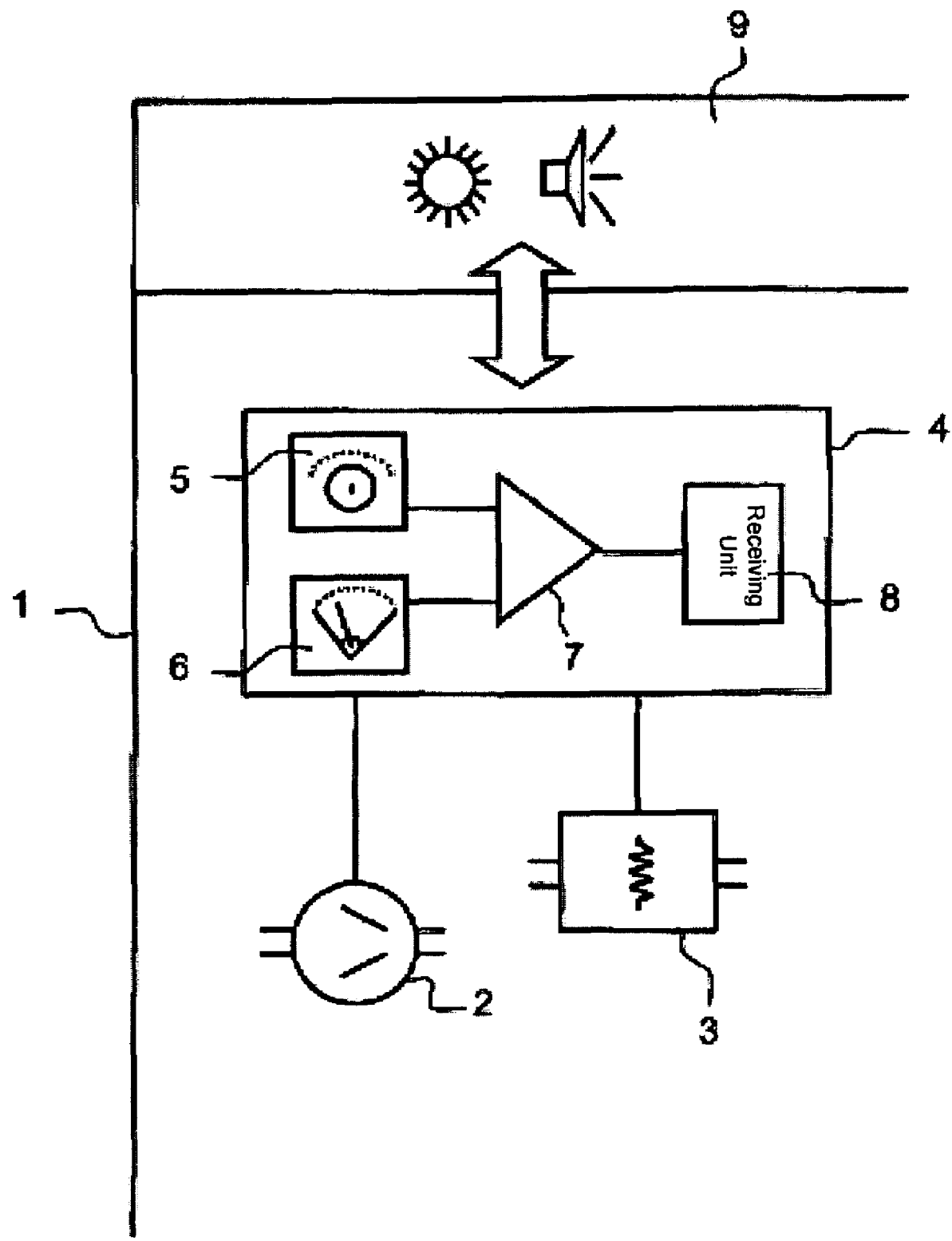

METHOD FOR CHECKING THE ELECTRICAL SAFETY OF A HOUSEHOLD APPLIANCE AND CORRESPONDING HOUSEHOLD APPLIANCE

CROSS-REFERENCE TO RELATED APPLICATION

This application is a continuation, under 35 U.S.C. § 120, of copending international application No. PCT/EP02/12946, filed Nov. 19, 2002, which designated the United States; this application also claims the priority, under 35 U.S.C. § 119, of German patent application No. 101 63 197.9, filed Dec. 21, 2001; the prior applications are herewith incorporated by reference in their entirety.

BACKGROUND OF THE INVENTION

Field of the Invention

The invention relates to a method for checking the electrical safety of a household appliance which has two or more electrical components as loads, and to a corresponding household appliance.

Household appliances, for example dishwashers, which are known to have two or more electrical loads such as pumps, heating systems, and the like, are not usually subject to individual checks as regards their electrical safety. Electrical safety is only ensured by breakers and fuses which are known to be provided anyway in the household wherein the household appliance is used. However, in most cases this is insufficient for checking the individual household appliance, since circuits having multiple sockets are usually protected by way of known household breakers. These household breakers are therefore set to a higher level of power consumption and are too slow to react to appliance-specific problems. Such a problem is brought about, for example, by leakage currents in the appliance which may result in electric shocks at the appliance. The electrical components may also become faulty over time, for example owing to wear and tear or incorrect use, with the result that the electrical safety of the household appliance is no longer ensured.

SUMMARY OF THE INVENTION

It is accordingly an object of the invention to provide a method for checking the electrical safety of a household appliance and an associated appliance, which overcomes the above-mentioned disadvantages of the heretofore-known devices and methods of this general type and which allows checking the electrical safety of the household appliance more effectively in a very simple manner.

With the foregoing and other objects in view there is provided, in accordance with the invention, a method for checking the electrical safety of a household appliance having two or more electrical components forming electrical loads, the method which comprises:

setting a setpoint value for a permissible power consumption of the household appliance for each of the electrical components thereof;

measuring an actual value of the power consumption of the household appliance in dependence on the electrical components currently in operation; and comparing the actual value with a corresponding setpoint value and, if the setpoint value is overshot, triggering a safety procedure.

With the above and other objects in view there is also provided, in accordance with the invention, a household appliance, comprising:

electrical components each forming an electrical load during operation;

a control device having:
  means for setting a setpoint value for the permissible power consumption for each of the electrical components of the household appliance;
  means for measuring an actual value for the power consumption of the household appliance in dependence on the electrical components in operation;
  means for comparing the actual value with a corresponding setpoint value; and
  means for triggering a safety measure when the setpoint value is overshot.

In other words, according to the invention, the method provides for a setpoint value or desired value for the permissible power consumption of the household appliance to be set for each of the electrical components. The electrical components in operation are measured, with a view to an actual value for the power consumption of the household appliance. The measured value is compared with the corresponding preset and, if the setpoint value is overshot, a safety measure is triggered.

The household appliance according to the invention has a control device which allows setting a setpoint value for the permissible power consumption for each of the electrical components of the household appliance, means for measuring an actual value for the power consumption of the household appliance, depending on the electrical components in operation, and means for comparing the actual value with the corresponding setpoint value, and means for triggering a safety measure when the setpoint value is overshot.

The electrical safety of the household appliance can be considerably improved by way of the desired/actual value comparison according to the invention, which is carried out for each individual load component by determining the permissible power consumption of the individual electrical components, for example before the appliance is put into operation or as part of a customer service etc.—preferably by the appliance manufacturer—and by measuring the actual power consumption when the appliance is in operation depending on the connected components. It is, in particular, no longer dependent on the household fuses and breakers, which cannot detect individual appliance-dependent increases in the power consumption—for example owing to hazardous leakage currents or faulty components, as is only possible with the invention. The control device of the household appliance having the means according to the invention advantageously prescribes, depending on the mode of operation—i.e. of the selected program, for example—which components are connected as loads, with the result that the determination of the setpoint value and of the actual value for the comparison of the power consumption is then carried out individually according to the active operating mode—wash program and/or drying program etc.—and the safety measure is triggered when the setpoint value is overshot by the actual value.

Furthermore, the power consumption of the individual loads in the individual subprogram steps, which may be different, owing to a treatment program which is selected by the user or runs automatically is known, with the result that, at known points in time in the subprogram steps at which only one load is operated, only this individual load is checked by means of the desired/actual value comparison according to the invention, that is to say a check is also carried out on the individual loads and a separate measure in relation to individual loads may become possible. It is thus possible to dispense with a separate electrical fuse for the individual loads. The invention provides a method and a household appliance by means of which the electrical safety of the household appliance can be checked more effectively in a very simple manner.

According to one development of the invention, it has proved advantageous for the setpoint value to be a tolerance value which is greater than the actually measured value for the power consumption of the household appliance. By way of the tolerance value—which can preferably be preset—it is possible for a safety value which is also greater than the normal power consumption to be set for the household appliance. In addition, the loads which can therefore advantageously be used and have a greater tolerance range can be used in a more cost-effective and simple manner in terms of manufacture.

The preferred safety measures according to alternative developments of the invention consist in the household appliance being disconnected, in one or more electrical components being disconnected, or in an acoustical and/or a visual warning signal being emitted at the household appliance.

The method according to the invention can be used in an advantageous manner preferably for any water-carrying household appliances, but particularly for dishwashers. The dishwasher, as is known, has a very large washing container for accommodating the items to be washed, which can be opened and closed by an appliance door. A control device, which controls the sequence of the program—for example a washing program—selected by the user of the dishwasher, recognizes the electrical components, which are connected depending on the mode of operation, as loads. These electrical components are, in the present example, a circulating pump and/or a detergent solution pump for moving the cleaning fluid or liquid detergent and/or a heating system for heating the cleaning fluid or liquid detergent etc. When the power consumption is measured, the desired/actual value comparison according to the invention is carried out for the power consumption. If the actually measured power—known from the measured actual value—overshoots the permitted setpoint value as a safety value—possibly taking into account the tolerance value which can be preset and is greater than the normal power consumption—for example for a pump, the entire dishwasher or the individual components, i.e. in this example the pump, can be automatically disconnected by the control device, or at least an acoustical and/or visual warning signal can be emitted at the control panel arranged above the door of the dishwasher.

Previously, for example after the operational and safety checks on the dishwasher in the manufacturer's factory, the individual electrical components were measured as loads at a constant voltage, and corresponding setpoint values generated and stored in the control device. It is therefore no longer necessary to take component tolerances into account. Once the control device has already measured the system voltage for the detection of a system failure, the setpoint value including the tolerance value which can be preset can be matched to the actually applied voltage.

The invention provides a method and a household appliance by means of which the electrical safety of the household appliance can be checked more effectively in a very simple manner.

Additional features which are considered as characteristic for the invention are set forth in the appended claims.

Although the invention is described herein as being embodied in a method for checking the electrical safety of a household appliance and corresponding household appliance, it is nevertheless not intended to be limited to the specific details, since various modifications and structural changes may be made therein without departing from the spirit of the invention and within the scope and range of equivalents of the following claims.

The construction and method of operation of the invention, however, together with additional objects and advantages thereof will be best understood from the following description of a specific embodiment when read in connection with the accompanying drawing.

BRIEF DESCRIPTION OF THE DRAWINGS

The sole FIGURE is a highly schematic illustration of a household appliance in accordance with the invention.

DETAILED DESCRIPTION OF A PREFERRED EMBODIMENT

Referring now to the FIGURE of the drawing in detail, the simplified illustration shows a water-carrying household appliance, here an exemplary dishwasher with a housing 1. The primary electrical components of interest here are a circulation pump 2 and a heater 3. The pump 2 and the heater 3 form electrical loads during the operation of the dishwasher. A control unit 4 drives the pump 2 and the heater 3, as well as all other components, in accordance with a given program of the dishwasher.

The control unit 4, inter alia, has means 5 for setting a desired value of the power consumption of each of the electrical components of the dishwasher, such as the pump 2 and the heater 3. The preset means 5 may be adjustable. Also, in a modification of the invention, the setpoint is a tolerance value that is greater than the actually measured value for the power consumption. The actual power consumption is measured with a measurement means 6. The measurement value depends on the component that is actually in operation at the time. A comparator 7 is connected to receive the setpoint value from the setpoint means 5 and the measured value from the measurement means 6. The two values are compared and, if the setpoint value is overshot by the measurement value, the comparator 7 issues a corresponding signal. The signal is received by a unit 8, which then triggers a safety measure if the setpoint value is overshot.

The setpoint value may be a tolerance value that is greater than the actually measured value for the power consumption of the household appliance. By equivalency, the comparator 7 may be set to issue the safety measure triggering signal only if the value received from the measurement means 6 is a given amount above the setpoint value received from the means 5. Similarly, the unit 8 may allow for a certain overlap tolerance of the signals before the safety measure is triggered.

The safety measure or safety procedure that is triggered by the unit 8 may take on any of a number of implementations. For example, the safety measure procedure comprises disconnecting the household appliance. In the alternative, only the individual electrical component of the household appliance may be disconnected. As a further alternative, or in addition, the safety procedure comprises emitting an acoustic and/or visual warning signal at a control panel 9 of the appliance.

We claim:

1. A method for checking and ensuring the electrical safety of a household appliance having at least two electrical components forming at least two individual electrical loads, including at least a first electrical component and a second electrical component, the method comprising the steps of:
    setting a setpoint value for a permissible power consumption for a first electrical component;
    setting a setpoint value for a permissible power consumption for a second electrical component;
    measuring an actual value of the power consumption of the first electrical component and the second electrical component dependent on the electrical components currently in operation based on the operational program of the appliance; and
    comparing each actual measured value with a respective setpoint value and, if a setpoint value is exceeded, initiating a safety procedure thereby rendering the appliance no longer dependent on the operation of a household circuit breaker.

2. The method according to claim 1, wherein the setpoint value is a tolerance value greater than the actually measured value for the power consumption of the household appliance.

3. The method according to claim 2, wherein the tolerance value is a preadjusted value.

4. The method according to claim 1, wherein the safety procedure comprises disconnecting the household appliance.

5. The method according to claim 1, wherein the safety procedure comprises disconnecting one or more electrical components of the household appliance.

6. The method according to claim 1, wherein the safety procedure comprises emitting at least one of an acoustic and visual warning signal.

7. The method according to claim 1, wherein the household appliance is a water-carrying household appliance.

8. The method according to claim 1, wherein the household appliance is a dishwasher.

9. In a household appliance, a control device programmed to implement the method according to claim 1.

10. A household appliance, comprising:
    at least two electrical components forming at least a first electrical load and a second electrical load during operation;
    a control device having:
    means for setting a setpoint value for the permissible power consumption for the first electrical component of the household appliance;
    means for setting a setpoint for the permissible power consumption of the second electrical component of the household appliance;
    means for measuring an actual value of the power consumption of the first electrical component and the second electrical component dependent on the electrical components currently in operation based on the operational program of the appliance; and
    means for comparing each actual measured value with a respective setpoint value and,
    means for initiating a safety measure when a setpoint value is exceeded, thereby rendering the appliance no longer dependent on the operation of a household circuit breaker.

11. A household appliance, comprising:
    at least two electrical components each forming an electrical load during operation that is different from the electrical load formed by at least one of the other electrical components;
    a control device having:
    means for controlling the sequence of a program the steps of which are implemented by bringing into operation various ones of the electrical components, the means for controlling the sequence of a program controlling which of the various electrical components are brought into operation to implement the program;
    means for setting a setpoint value for the permissible power consumption of the respective electrical components of the household appliance in operation at each step of the program;
    means for measuring an actual value for the power consumption of the household appliance in dependence on the respective electrical components currently in operation at each step of the program;
    means for comparing the actual value with a corresponding setpoint value; and
    means for initiating a safety measure when a respective setpoint value is exceeded, thereby rendering the appliance no longer dependent on the operation of a household circuit breaker.

12. The household appliance according to claim 11, wherein the means for controlling the sequence of a program is operable to control the sequence of a dishwashing program.

13. The household appliance according to claim 12, wherein one of the electrical components is a circulating pump and another of the electrical components is a heating system for heating a selected one of a cleaning fluid and a liquid detergent.

* * * * *